Sept. 16, 1941. H. J. TYZZER Re. 21,902

PUSH BUTTON TUNING DEVICE

Original Filed Feb. 24, 1938 2 Sheets-Sheet 1

INVENTOR.
HOWARD J. TYZZER.
BY
Allen & Allen
ATTORNEYS.

Sept. 16, 1941. H. J. TYZZER Re. 21,902
PUSH BUTTON TUNING DEVICE
Original Filed Feb. 24, 1938 2 Sheets-Sheet 2
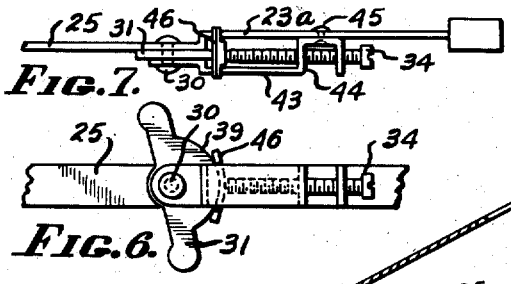
FIG. 7.
FIG. 6.
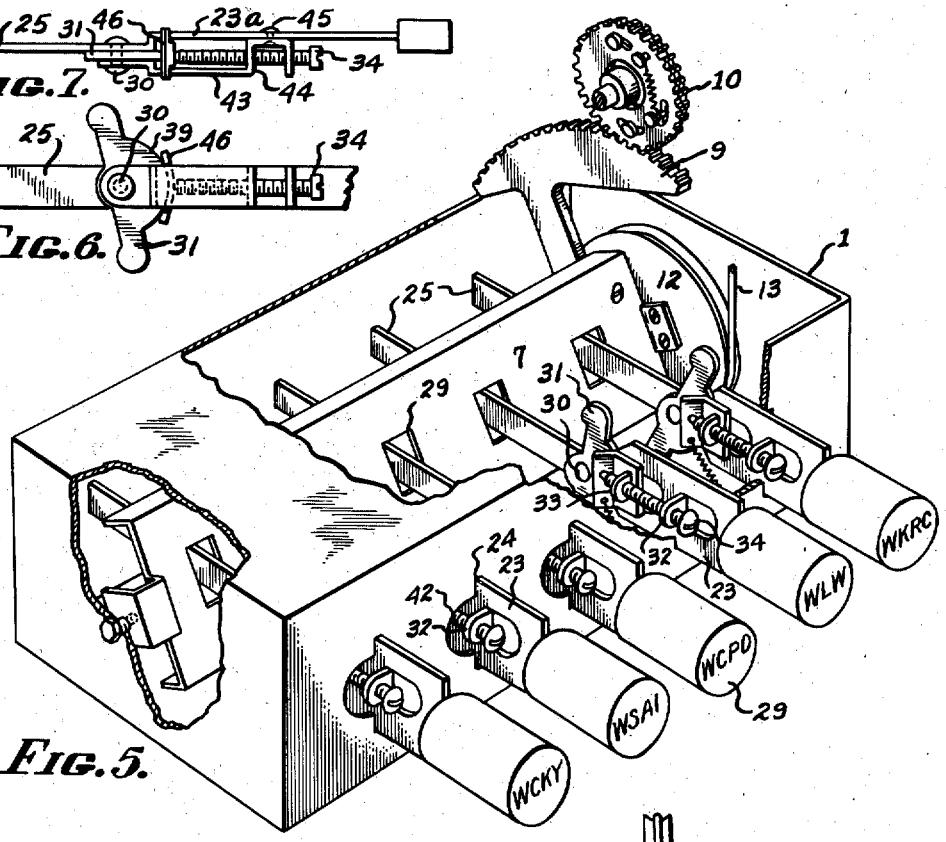
FIG. 5.
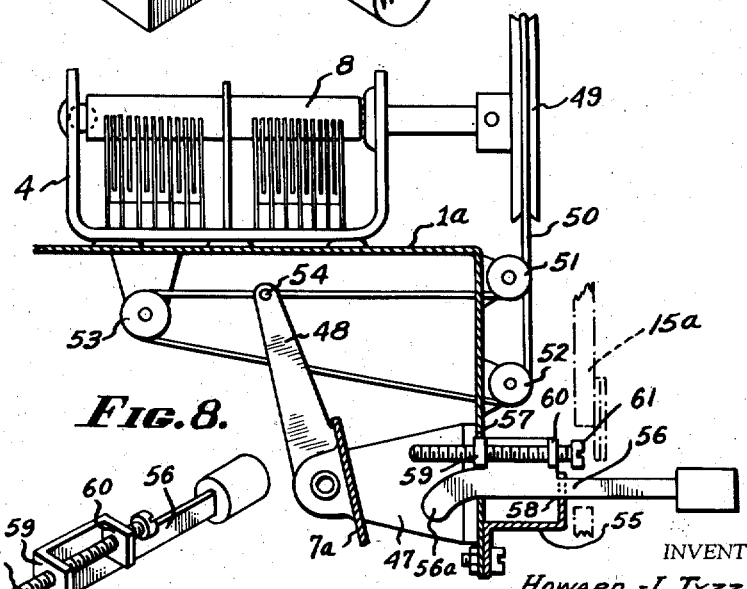
FIG. 8.
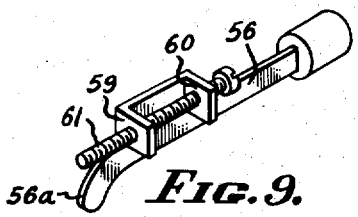
FIG. 9.
INVENTOR.
HOWARD J. TYZZER.
BY
Allen & Allen
ATTORNEYS.

Reissued Sept. 16, 1941

Re. 21,902

UNITED STATES PATENT OFFICE 21,902

PUSH BUTTON TUNING DEVICE

Howard J. Tyzzer, Montclair, N. J., assignor to The Crosley Corporation, Cincinnati, Ohio, a corporation of Ohio Original No. 2,222,789, dated November 26, 1940, Serial No. 192,258, February 24, 1938. Application for reissue May 7, 1941, Serial No. 392,397

17 Claims. (Cl. 74—10)

My invention relates to what may be termed semi-automatic tuning devices for radio sets and the like. The popularity of means for effecting the rapid tuning of radio sets to certain preselected stations appears to be on the increase. A number of different types of tuning devices have been developed, including those operated by electric motors; but mechanical systems are in general less expensive to construct. My invention relates to a particular mechanical system; and it has for its objects the provision of an organization in which tuning is effected by the actuation of push buttons, in which the space requirements are very small and in which the apparatus is simple and easy to construct, inexpensive and not liable to get out of repair.

Since modern day radio sets are of the superheterodyne type, they require by reason of their selectivity, extremely accurate tuning. It is therefore my object to provide a mechanical organization capable of giving this extremely accurate tuning; but it is further my object to provide a structure and arrangement of parts wherein this accuracy is secured without the necessity of extreme accuracy in the manufacture of the several parts of the apparatus. As a consequence of this, the device of my invention is characterized by a smaller cost than has hitherto characterized mechanical tuning devices.

These and other objects of my invention which will be set forth hereinafter or will be apparent to one skilled in the art upon reading the specification, I accomplish by that certain construction and arrangement of parts of which I shall hereinafter describe certain preferred embodiments. Reference may now be made to the drawings wherein:

Fig. 3 is a horizontal sectional view taken along the lines 3—3 of Fig. 2.

Figs. 6 and 7 are respectively plan and elevational views of another type of plunger assembly which may be employed in the device of Figs. 1 and 5.

Fig. 8 is a vertical section through another embodiment of my apparatus.

Fig. 9 is a plunger assembly suitable for use with the embodiment of Fig. 8.

Briefly, in the practice of my invention, I provide a pivoted plate adapted to swing about a longitudinal axis. This plate is connected by a suitable drive to the shaft of a gang condenser or other tuning means in the radio set. I provide also a plurality of push buttons having plungers to guide their movements, and in connection with these push buttons I provide means on the plungers to determine the position of the plate when the push buttons are depressed. In this way the actuation of any particular push button will cause the plate to assume a position peculiar to that button, and as a consequence, the shaft of the gang condenser will be rotated to a predetermined setting very accurately.

Figure 1:
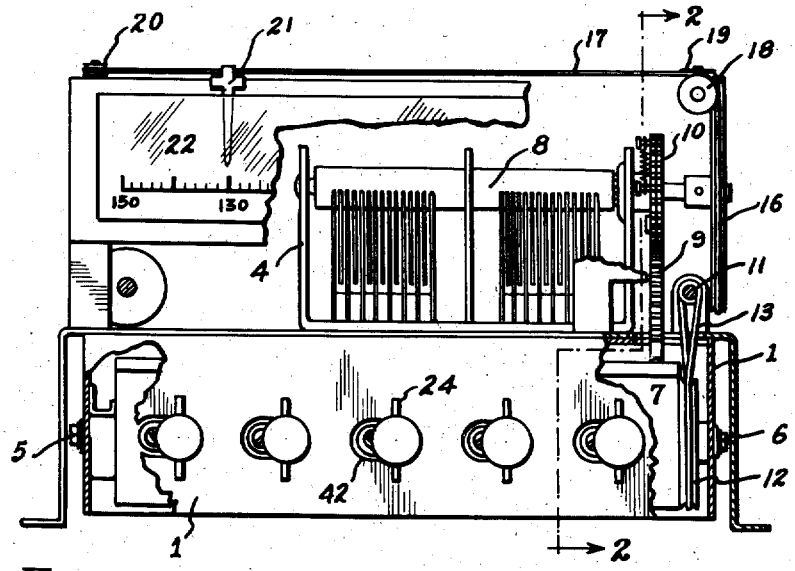
Figure 1 is an elevational view, with parts broken away, of one form of my device.
Figure 2:
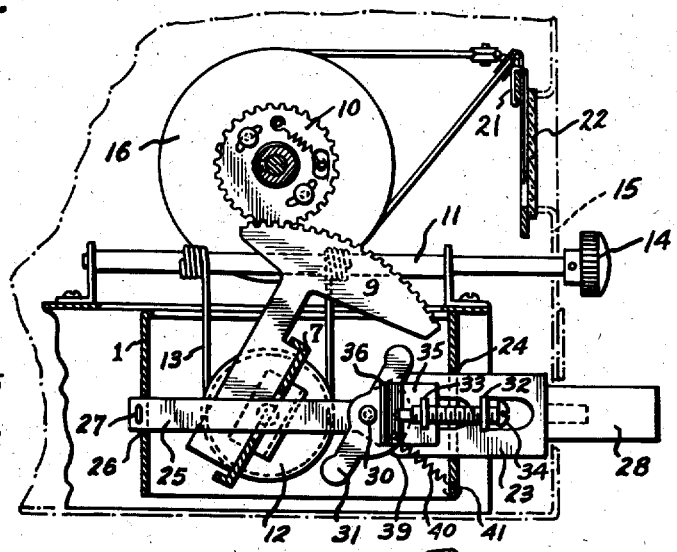
Fig. 2 is a sectional view taken along the lines 2—2 of Fig. 1.
Figure 5:
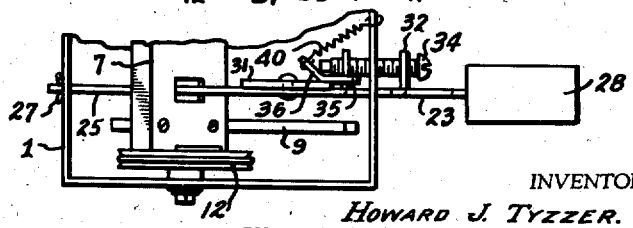
Fig. 5 is a perspective view of the assembly of Fig. 1.

In the embodiment of Figs. 1, 2, 3, and 5, I have shown an organization of apparatus wherein if the series of push buttons is located at the front of the radio set, the axis of the gang condenser is parallel to the front of the radio cabinet. In the embodiment of Fig. 8, I have shown a style of apparatus wherein under the same conditions, the shaft of the gang condenser is normal to the front of the radio cabinet. It will be understood that modifications may be made in my apparatus without departing from the spirit of my invention, and in particular the different types of drives between the plate to which I have referred and the gang condenser shaft, or other tuning device, may be varied, if desired. By way of a single example, but without limitation, if it is desired to use the apparatus of Figs. 1 and 5 in a radio set in which the gang condenser shaft is normal to the front of the cabinet, it will be within the skill of the worker in the art to interpose between the driven gear and the condenser shaft, a pair of beveled gears or the like, so that the condenser shaft can be located as desired.

Figure 4:
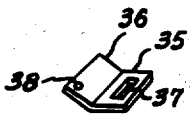
Fig. 4 is a perspective view of a locking member employed with the push button assembly of the foregoing figures.

In the embodiment of Figs. 1 to 5, I have illustrated a casing 1, in which the apparatus is mounted. This casing is preferably, though not necessarily located below the gang condenser 4 of the radio set. In the casing upon suitable pivots 5 and 6 I mount a plate 7. As I have indicated, a suitable drive is established between this plate and the condenser gang shaft 8. In the particular embodiment illustrated in these figures, a gear segment 9 is fastened to the plate so that the toothed edge is concentric with the pivot point of the plate. A meshing gear 10 is fastened to the gang condenser drive shaft. In order to take up lost motion, this gear may comprise two mating parts, one of which is fastened to the shaft 8, and the other of which is slightly rotatable on the shaft and is actuated by a spring. A gear arrangement of this type is well known in the art and has been illustrated by me in Figs. 2 and 5; but it does not require special description.

In the particular embodiment which I am now describing, a shaft 11 is mounted above the casing 1 on suitable bearing brackets and is the manual tuning shaft for the radio set. A sheave 12 is non-rotatably fastened to the plate, so as to rotate it about the pivots 5 and 6. A belt 13 is looped over this sheave and at its ends is wound in opposite directions about the shaft 11, and fastened to this shaft. A tuning knob 14 may be fastened to the shaft 11 where it projects beyond the front rim of the radio cabinet, indicated in Fig. 2 at 15. A longitudinal indicator has been illustrated in Figs. 1 and 2. Here a sheave 16 is fastened to the condenser gang shaft 8. An endless belt 17 is looped about the sheave 16, passes over small sheaves 18 and 19 and is carried horizontally above the gang condenser and parallel with the front 15 of the radio cabinet, returning over a small sheave 20. A pointer 21 is fastened to this belt and moves over a scale or dial 22.

It will be evident from the construction thus far described that the radio set may be tuned by means of the knob 14, but that it may also be tuned by anything which tends to rotate the plate 7 about its pivots. When the plate 7 is moved to tune the radio set, the shaft 11 is rotated thereby; but the shaft 11 is an insignificant frictional load.

For moving the plate for automatic tuning I provide a series of plungers. Each plunger has an enlarged body portion 23 which is slidably mounted in a slot 24 in the front member of the casing 1. The plunger also has a tail 25 which is slidably mounted in a slot 26 in the back wall of the casing 1. In order to limit the forward movement of the plunger assembly, a cotter pin or the like 27, may be passed through the hole in the tail of the plunger beyond the back wall of the casing. Each plunger likewise has a forwardly extending portion 28 upon which push buttons 29 may be placed. The push buttons are marked, or are so constructed that they may be provided with indicia showing the particular station to which each push button will be effective in tuning the radio set. The tail 25 of each push button passes through a perforation 29 in the plate 7, the perforation being large enough to permit rotation of the plate through the desired arc without interference from the tail.

So that each push button may, when depressed, bring about a desired angularity of the plate 7, I pivot to each plunger body, as at 30, an arm 31. At each end of this arm there is a slight protuberance, as illustrated, and it will be evident that if the arm is fastened to the plunger body with a certain angular relationship, and if the push button is depressed so as to bring the arm 31 against the plate 7, the arm will be effective in causing the plate 7 to assume the same angularity. I provide means for locking the several arms in the desired angular relationships. To this end, I prefer to strike up from the body 23 two lugs 32 and 33, and to thread a set screw 34 into these lugs. A locking member illustrated in Fig. 4 comprises two angularly related portions 35 and 36. The portion 35 is slotted as at 37, so that it will pass over the lug 32 and be held in place by the set screw 34. The portion 36 also has a small perforation 38. These parts are assembled as most clearly shown in Figs. 3 and 4. The semi-circular part 39 on the forward portion of the arm 31 underlies the locking member 35—36. When the set screw 34 is tightened, the end of it bears against the portion 36 of the locking member, so as to depress this portion against the portion 31 of the arm. This binds the arm tightly against the body 23 and fixes its angular position. A tension spring 40 may be engaged between the perforation 38 in the locking member and a perforation 41 in the front wall of the casing 1. This spring keeps the plunger assemblies in the forward position. The slot 24 in the front wall of the casing 1 is enlarged sidewise, as shown at 42 in Fig. 1, so as to pass the lugs 32 and 33.

When it is desired to set up the apparatus for automatic tuning, a particular one of the push buttons is selected as appropriate for a selected station. The set screw 34 is loosened. The radio set is tuned to the selected station, and while maintaining this tuning the operator depresses the appropriate plunger. Since the arm 31 is now loosely pivoted upon the body 23, the plate 7 will cause it to assume a particular angular position on the plunger. When this position is attained the set screws 34 is tightened up to bend the arm; and the plunger is released. Thereafter, whenever the same plunger is depressed, and whatever may be the initial position of the plate 7, the plate will be brought to an angular position determined by the fixed position of the arm 31; and the radio set will thereby be tuned to the selected station. Similar procedures for other stations are followed with the other push buttons in the assembly. The number of push buttons provided does not constitute a limitation upon my invention.

I have shown in Figs. 6 and 7 a modified form of plunger in which I have given to like parts like index numerals. In this particular form, the arm 31 is pivoted as at 30, between the body portion 23a and a piece of sheet metal 43 which is interspaced from the body 23a, as shown, except that at the forward end it is bent into a U-shape 44, the base of which is riveted to the body 23a at 45. The set screw 34 is threaded in the legs of the U. The end of the set screw bears against a friction member or shoe 46. This shoe is placed between the body 23a and the member 43 and, as shown; and where it extends beyond these members it is made wider to prevent displacement. The shoe 46 bears against the semi-circular portion 39 of the arm 31 and serves to fix it in position.

I have shown a somewhat different type of organization in Figs. 8 and 9. Here a casing 1a has been provided, the condenser gang 4 being mounted thereabove, as previously described, excepting that the shaft of the gang condenser is normal to the plane of the front wall of the casing 1a, and therefore is normal to the plane of the front of the radio cabinet indicated at 15a. It will be understood that the casing 1a may be the chassis of the radio set. The plate 7a in this instance is pivoted to brackets 47. For a driving connection between the plates 7a and the gang condenser shaft 8, I have shown the following: an arm 48 is fixed to the plate 7a. The condenser shaft is provided with a sheave 49. An endless belt 50 is looped under this sheave, passes over small sheaves 51 and 52, and is carried backwardly beneath the top wall of the casing 1a to return over a rearward sheave 53. The arm 48 is fastened to the belt 50, as at 54. It will be clear that the position of the arm 48, by reason of the drive which has been described, will determine the position of the shaft 8. The condenser gang in this instance may have any of the usual forms of manual drive including, if desired, a vernier drive.

To the front portion of the casing 1a, I fasten a bracket 55. A plunger indicated generally at 56, is slidably mounted in slots 57 and 58 respectively in the front wall of the casing 1a and in the bracket 55, as clearly shown in Fig. 8. The rear portion of the plunger has a downwardly turned member 56a. Ears 59 and 60 are formed on the plunger 56 and a set screw 61 is threaded in these ears. The end of the set screw is interspaced, as shown, from the plunger projection 56a, and these two parts form, after adjustment, the means for bringing the plate 7a to the desired angular position.

When setting up this apparatus the radio set is again tuned to a selected station by hand and a plunger selected as appropriate to that station. The set screw 61 is loosened and the plunger 56 is depressed until its projection 56a bears against the plate 7a. While maintaining this position of the plunger, the operator next turns the set screw 61 until the end of it also lies against the plate 7a. The setting is now complete. Thereafter when the plunger is depressed the combined action of the set screw 61 and the plunger projection 56a (the one lying above and the other below the pivot points of the plate 7a), will be to bring the plate 7a to the angular position previously determined.

As has been indicated hereinabove, wide modifications may be made in my invention without departing from the spirit thereof. Having thus described my invention, I append claims relating to that which I consider new therein, and desire to secure by Letters Patent:

1. In an automatic tuning device, in combination with mechanism to be tuned, a positionable member connected to said mechanism for rotating the same, and mounted for rotation about an axis, a plunger member movable longitudinally in a direction transverse to said axis, a positioning member pivoted on said plunger for contacting and moving said positionable member, and means for locking said positioning member in a selected angular relationship on said plunger, said locking means comprising frictional means having attachment to said plunger member and bearing against said positioning member, and a set screw on said plunger bearing against said frictional means.

2. In an automatic tuning device, in combination with a mechanism to be tuned, a member pivoted to turn about one of its axes, a drive between said member and said mechanism, a plunger longitudinally movable in a direction transverse to said axis, an arm centrally pivoted on said plunger for contacting and moving said member, and means for locking said arm in a selected angular position on said plunger, said means comprising frictional retaining means movable on said plunger and engaging said arm, and a set screw on said plunger engaging said retaining means.

3. In an automatic tuning device, in combination with a mechanism to be tuned, a member pivoted to turn about one of its axes, a drive between said member and said mechanism, a plunger longitudinally movable in a direction transverse to said axis, an arm centrally pivoted on said plunger for contacting and moving said member, and means for locking said arm in a selected angular position on said plunger, said means comprising an angular part connected to said plunger and having a portion engaging said arm, and a set screw on said plunger engaging said angular part and binding it against said arm.

4. In an automatic tuning device, in combination with a mechanism to be tuned, a member pivoted to turn about one of its axes, a drive between said member and said mechanism, a plunger longitudinally movable transversely to said member, an arm pivoted on said plunger so as to be positionable by said member when brought thereagainst by said plunger, and means for locking said arm in position on said plunger so that thereafter said arm acts to position said member when brought thereagainst by said plunger.

5. In an automatic tuning device, in combination with a mechanism to be tuned, a casing, a member pivoted to turn on one of its axes in said casing, a connection between said member and said mechanism, a series of plungers slidably mounted in said casing for motion transversely to and through said axis and adjustable means on said plungers for swinging said member to predetermined angular positions, said means comprising an arm pivoted centrally to each plunger and means on said plunger for locking said arm to said plunger, each said arm having end portions for contacting said member on each side of its said axis.

6. In an automatic tuning device, in combination with a mechanism to be tuned, a casing, a member pivoted to turn on one of its axes in said casing, a connection between said member and said mechanism, a series of plungers slidably mounted in said casing for motion transversely to and through said axis, and adjustable means on said plungers for swinging said member to predetermined angular positions, said means comprising an arm pivoted centrally to each plunger, and means on said plunger for locking said arm to said plunger, said means comprising frictional retaining means movable on said plunger and engaging said arm, and a set screw on said plunger engaging said retaining means, each said arm having end portions for contacting said member on each side of its said axis.

7. In an automatic tuning device, in combination with a mechanism to be tuned, a casing, a member pivoted to turn about one of its axes in said casing, a connection between said member and said mechanism, a series of plungers slidably mounted in said casing for motion transversely to and through said axis, and adjustable means on said plungers for swinging said member to predetermined angular positions, said means comprising an arm pivoted centrally to each plunger, and means on said plunger for locking said arm to said plunger, said means comprising frictional retaining means movable on said plunger and engaging said arm, and a set screw on said plunger engaging said retaining means, said plungers extending through a wall of said casing, and said set screws accessible through said wall, each said arm having end portions for contacting said member on each side of its said axis.

8. In an automatic tuning device, in combination with a mechanism to be tuned, a casing, a member pivoted to turn about one of its axes in said casing, a connection between said member and said mechanism, a series of plungers slidably mounted in said casing for motion transversely to and through said axis, and adjustable means on said plungers for swinging said member to predetermined angular positions, said means comprising an arm pivoted centrally to each plunger and means on said plunger for locking said arm to said plunger, said means comprising frictional retaining means movable on said plunger and engaging said arm, and a set screw on said plunger engaging said retaining means, said plungers having a bearing in the walls of said casing on each side of said axis in one direction, and each said arm having end portions for contacting said member on each side of its said axis in another direction.

9. In an automatic tuning device, in combination with a mechanism to be tuned, a casing, a member pivoted to turn on one of its axes in said casing, a connection between said member and said mechanism, a series of plungers slidably mounted in said casing for motion transversely to and through said axis, and adjustable means on said plungers for singing said member to predetermined angular positions, said means comprising an arm pivoted centrally to each plunger and means on said plunger for locking said arm to said plunger, said means comprising an angular part pivoted to said plunger and having a portion engaging said arm, and a set screw on said plunger engaging said angular part and binding it against said arm, each said arm having end portions for contacting said member on each side of its said axis.

10. In a plunger device for automatic tuning means, a plunger having bearing surfaces by which it may be mounted for longitudinal movement, and positioning means pivoted to said plunger, said positioning means comprising an arm having portions at its ends for contacting and positioning a movable member, and an intermediate portion having an outline of substantially semi-circular form concentric with the point at which said positioning means is pivoted to said plunger, said plunger bearing means for effecting frictional contact with said last mentioned portion of said positioning means, and a set screw extending longitudinally of said plunger for actuating said frictional contact means.

11. In a plunger device for automatic tuning means, a plunger having bearing surfaces by which it may be mounted for longitudinal movement, and positioning means pivoted to said plunger, said positioning means comprising an arm having portions at its ends for contacting and positioning a movable member, and an intermediate portion having an outline of substantially semi-circular form concentric with the point at which said positioning means is pivoted to said plunger, said plunger bearing means for effecting frictional contact with said last mentioned portion of said positioning means, and a set screw extending longitudinally of said plunger for actuating said frictional contact means, said frictional contact means comprising a portion having a face adapted to lie in contact with a face of said semi-circular portion of said positioning means, and means whereby said set screw is rendered effective in clamping said frictional contact means against said positioning means and said positioning means against said plunger, so that said semi-circular portion of said positioning means is clamped and held by the frictional interengagement of at least two pairs of faces.

12. Plunger means for use in an automatic tuning device comprising a plunger having bearing surfaces upon which it may be mounted for longitudinal movement and positioning means pivoted to said plunger, said positioning means having end portions extending on opposite sides of said plunger for contacting and positioning another element in accordance with the angular relationship of said positioning means to said plunger, said positioning means having a face portion adapted for frictional engagement with said plunger and another face portion, a locking member positioned for frictional engagement with said last mentioned face portion and means on said plunger for operating said locking member so as to effect said frictional engagements.

13. A control device of the character described comprising, in combination, a supporting frame, a plurality of laterally spaced and parallel push bars slidably mounted on said frame, cam devices adjustably mounted on said push bars, a common follower member for said cam devices adapted to be connected to a tuning device, means for securing said cam devices in their adjusted positions comprising clamping members movably supported on the push bars, screw threaded devices engaging in correspondingly screw threaded portions of said push bars and operable to apply the clamp members to the cam devices, and spring means for returning the push bars to inoperative positions.

14. In an automatic tuning device, in combination with a mechanism to be tuned, an elongated member pivoted to turn about its longitudinal axis, a connection between said member and said mechanism, plungers longitudinally movable transversely to said axis and having portions passing through said axis, said elongated member being perforated in its central portion to permit passage of said plungers, and means on said plungers for swinging said elongated member to determined angular positions when said means are brought against said elongated member respectively.

15. Apparatus as claimed in claim 14 including bearing means for said plungers on each side of said elongated member.

16. Apparatus as claimed in claim 14 including bearing means for said plungers on each side of said elongated member, said means on said plungers being adjustable as to position with respect thereto.

17. In automatic tuning apparatus a mechanism to be tuned, a member pivoted to swing about one of its axes, a connection between said member and said mechanism, a plunger movable on a longitudinal axis transversely to the axis of said member for moving said member, said plunger having a head for manual operation, adjustable means on said plunger for positioning said member and mechanism arranged to retain said adjustable means in adjusted position, said mechanism available for operation adjacent the end of said plunger, the said combination including a front panel through which the plunger projects, said adjustable means being accessible from the front of said panel.

HOWARD J. TYZZER.